US008530854B1

(12) United States Patent
Derzon et al.

(10) Patent No.: US 8,530,854 B1
(45) Date of Patent: Sep. 10, 2013

(54) MICRO GAS-PUFF BASED SOURCE

(71) Applicant: Sandia Corporation, Albuquerque, NM (US)

(72) Inventors: Mark S. Derzon, Albuquerque, NM (US); Paul C. Galambos, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/647,970

(22) Filed: Oct. 9, 2012

(51) Int. Cl.
*H01J 27/02* (2006.01)
*H01J 49/12* (2006.01)
*H05H 1/24* (2006.01)

(52) U.S. Cl.
USPC ............ 250/423 R; 250/424; 250/423 F; 315/111.21; 315/111.81; 315/111.91; 378/119

(58) Field of Classification Search
USPC ............ 250/423 R, 424, 423 F; 315/111.21, 315/111.81, 111.91; 378/119
See application file for complete search history.

(56) References Cited

U.S. PATENT DOCUMENTS

| | | | | |
|---|---|---|---|---|
| 5,525,805 A | * | 6/1996 | Greenly ................. | 250/423 R |
| 6,586,757 B2 | * | 7/2003 | Melnychuk et al. ...... | 250/504 R |
| 7,291,853 B2 | * | 11/2007 | Fomenkov et al. ....... | 250/504 R |

OTHER PUBLICATIONS

Akunets, et al., "Measuring of spatio-temporal characteristics Z-pinch from deuterated polyethylene", European Physical Journal D, vol 54, No. 2, 2009, pp. 499-502.

Anan'ev, et al., "X-Pinch-Based Neutron Source", Plasma Physics Reports, vol. 36, No. 7, 2010, pp. 601-608.

Derzon, et al., "Analytical Estimation of Neutron Yield in a Novel Micro Gas-puff X Pinch", Journal of Applied Physics, 2012, pp. 1-39.

Derzon, et al., "Safety Analysis of High Pressure 3He-filled Microchannels for Thermal Neutron Detection", Retrieved at <<http://prod.sandia.gov/techlib/access-control.cgi/2008/087427.pdf>>, Sandia National Laboratories, Nov. 2008, pp. 1-43.

Galambos, et al., "Active MEMS Valves for Flow Control in a High-Pressure Micro-Gas-Analyzer", Journal of Microelectromechanical Systems, vol. 20, No. 5, Oct. 2011, pp. 1-13.

Ghodke, et al., "Standardisation of Water-Moderated Am-241-Be Neutron Source Using De Pangher Neutron Long Counter; Experimental and Monte Carlo Modelling", Radiation Protection Dosimetry, vol. 148, No. 3, 2012, pp. 358-365.

(Continued)

*Primary Examiner* — Nikita Wells
(74) *Attorney, Agent, or Firm* — Medley Behrens & Lewis LLC; Todd Behrens

(57) ABSTRACT

Various technologies described herein pertain to a micro gas-puff based source of neutrons, x-rays, and/or energetic particles. The micro gas-puff based source can generate plasma, which can emit neutrons, x-rays, and the like. The micro gas-puff based source includes a diode, which further includes an anode and a cathode. Further, a chamber is between the anode and the cathode. Moreover, a MEMS gas supply can inject a puff of gas between the anode and the cathode within the chamber, where the MEMS gas supply shapes the puff of gas to form a quasispherical density profile of gas created in various of geometries. Further, a pulsed power supply applies a voltage across the anode and the cathode to cause compression of the puff of gas to form the plasma.

20 Claims, 10 Drawing Sheets

(56) References Cited

OTHER PUBLICATIONS

Gribkov, V. A., "Current and Perspective Applications of Dense Plasma Focus Devices", Retrieved at <<http://www.cfn.ist.utl.pt/17IAEATM_RUSFD/doc/files/proceedings/IT6.pdf>>, AIP Conference Proceedings, Plasma and Fusion Science: 17th IAEA Technical Meeting on Research Using Small Fusion Devices, vol. 996, Oct. 22-24, 2007, pp. 51-64.

Gribkov, et al., "On the Possibility of Creating a Neutron Source on the Basis of a Micropinch with Combined Plasma-Heating", Transactions of the American Nuclear Society, vol. 38, Jun. 1981, pp. 207-208.

Gribkov, et al., "Powerful Neutron Source Based on a Z-Pinch", Retrieved at <<http://www.jetpletters.ac.ru/ps/1699/article_25829.pdf>>, Jetp Letters, vol. 18, No. 9, Nov. 5, 1973, pp. 319-321.

Hammer, et al., "X-Pinch Soft-X-Ray Source for Microlithography", Applied Physics Letters, vol. 57, No. 20, Nov. 12, 1990, pp. 2083-2085.

Klir, et al., "Deuterium gas puff Z-pinch at currents of 2 to 3 mega-ampere", Physics of Plasmas, vol. 19, No. 3, Mar. 2012, pp. 1-11.

Marquez, et al., "Modelling of the internal dynamics and density in a tens of joules plasma focus device", Physics of Plasmas, vol. 19, No. 1, 2012, pp. 1-6.

Mather, et al., "Stability of the Dense Plasma Focus", Physics of Fluids, vol. 12, No. 11, 1969, pp. 2343-2347.

Meehan, et al., "Praseodymium activation detector for measuring bursts of 14 MeV neutrons", Nuclear Instruments and Methods in Physics Research A, vol. 620, Issue 2-3, Aug. 2010, pp. 397-400.

Niranjan, et al., "Note: A portable pulsed neutron source based on the smallest sealed-type plasma focus device", Review of Scientific Instruments, vol. 82, No. 2, 2011, pp. 1-3.

Nugent, Keith A, "Coherent methods in the X-ray sciences", Retrieved at <<http://arxiv.org/ftp/arxiv/papers/0908/0908.3064.pdf>>, Advances in Physics, vol. 59, No. 1, 2010, pp. 1-158.

Galambos, et al., "Low Leak Rate MEMS Valves for Micro-Gas-Analyzer Flow Control", Transducers, 2009, pp. 1658-1661.

Papadopoulos, et al. "Air Entrainment Studies for a Supersonic Micro-Ejector System", Retrieved at <<http://www.eng.uah.edu/~williams/Documents/papers/Air_Entrainment_Studies_for_Supersonic_Micro-Ejector_system.pdf>>, Aug. 10-14, 2008, pp. 1-7.

Pereira, et al., "K-line spectra from tungsten heated by an intense pulsed electron beam", Review of Scientific Instruments, vol. 81, No. 10, 2010, pp. 1-5.

Runkle, Robert C., "Neutron sensors and their role in nuclear non-proliferation", Nuclear Instruments and Methods in Physics Research A, vol. 652, No. 1, 2011, pp. 37-40.

Ryutov, et al., "The physics of fast Z pinches", Reviews of Modern Physics, vol. 72, No. 1, Jan. 2000, pp. 167-223.

Ryutov, et al., "Simulating the magnetized liner inertial fusion plasma confinement with smaller-scale experiments", Physics of Plasmas, vol. 19, 2012, pp. 1-9.

Seagrave, et al., "D(d,n)He-3 and T(d,n)He-4 Neutron Source Handbook", DOE, Los Alamos, Los Alamos National Laboratories, 1958, pp. 1-40.

Shiloh, et al., "Z-Pinch of a Gas Jet", Physical Review Letters, The American Physical Society, vol. 40, No. 8, Feb. 20, 1978, pp. 1-10.

Soto, Leopoldo, "Invited papers from the 15th International Congress on Plasma Physics combined with the 13th Latin American Workshop on Plasma Physis", Plasma Physics and Controlled Fusion, vol. 53, No. 7, 2011, pp. 1-2.

Soto, et al., "An Ultra Miniature Pinch Focus Discharge Operating with Submillimetric Anodes and Energy of 0.1 Joule: Nanofocus", Dense Z-Pinches: 8th International Conference on Dense Z-Pinches, 2006, pp. 211-214.

Soto, et al., "Studies on scalability and scaling laws for the plasma focus: similarities and differences in devices from 1 MJ to 0.1 J", Plasma Sources Science and Technology, vol. 19, 2010, pp. 1-9.

Tabak, et al., "Review of progress in fast ignition", Physics of Plasmas, vol. 12, No. 5, May 2005, pp. 1-8.

Tarifeno-Saldivia, et al., "Behavior of Low Energy Fast Plasma Focus Devices as D-D Fusion Neutron Sources", American Institute of Physics Conference Proceedings, IX Latin American Symposium on Nuclear Physics and Applications, vol. 1423, 2012, pp. 1-7.

Veloso, et al., "Correlations Among Neutron Yield and Dynamical Discharge Characteristics Obtained from Electrical Signals in a 400 J Plasma Focus", Journal of Fusion Energy, vol. 31, No. 1, 2012, pp. 30-37.

Welch, et al. "Kinetc simulatons of a deuterium-tritium Z pinch with >10(16) neuton yield", Physics of Plasmas, vol. 18, No. 5, 2011, pp. 1-7.

Gribkov, et al., "Nanosecond Radiation Pulses for Rapid Detection of Explosives", Retrieved at <<http://www-naweb.iaea.org/napc/physics/meetings/TM29225/prcdngs/papers/A-03.pdf>>, Proceedings of the IAEA Technical Meeting on Humanitarian Demining, 2005, pp. 1-6.

Anan'ev, et al., "Studues of Plasma Dynamics in Megampere X-Pinches", Plasma Physics Reports, vol. 35, No. 6, 2009, pp. 459-470.

Bushutin, et al., "Study of the Contributions of the Electrode Materials to the Plasma ot a High-Current Vacuum Spark", Plasma Physics Reports, vol. 38, No. 3, 2012, pp. 235-243.

Dolgov, et al., "Experimental Study of the Spatial Structure of High-Energy Ion Sources in Micropinch", Plasma Physics Reports, vol. 38, No. 2, 2012, pp. 149-152.

Dolgov, A. N., "Self-Consistent Electron and Ion Flows in a Fast Z-Pinch", Plasma Physics Reports, vol. 31, No. 6, 2005, pp. 493-496.

Gribkov, et al., "PF-6—an effective plasma focus as a source of ionizing radiation and plasma streams for application in material technology, biology and medicine", Nukleonika, vol. 51, No. 1, 2006, pp. 55-62.

Gribkov, et al., "A single-shot nanosecond neutron pulsed technique for the detection of fissile materials", 2nd International Workshop on Fast Neutron Detectors and Applications, Nov. 6-11, 2011, pp. 1-22.

Shiloh, et al., "Interferometry of a gas-puff z-pinch plasma", Appl. Phys. Lett., vol. 35, No. 6, Sep. 1, 1979, pp. 390-392.

Soto, Leopoldo, "New trends and future perspectives on plasma focus research", Plasma Physics and Controlled Fusion, vol. 47, 2005, pp. 361-381.

Soto, et al., "Repetitive Nanofocus: Evidence of neutron and x-ray emission from an ultra miniature pinch plasma focus discharge operating at tens of Hz", Plasma and Fusion Science, 2008, pp. 72-75.

\* cited by examiner

MICRO GAS-PUFF BASED SOURCE

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Neutrons can be utilized for various applications. Production of monoenergetic neutrons is commonly performed using either a beam-on-target configuration or a plasma configuration, which can create a center-of-mass energy for deuterium-deuterium (DD) or deuterium-tritium (DT) fusion (e.g., 2.5 MeV and 14 MeV). These devices can be referred to as neutron sources. Sources in a beam-on-target configuration can be DC (constant beam) or pulsed. In some instances, radioactive sources such as plutonium-beryllium (PuBe) or americium (Am) can be used. Yet, radioactive sources can have a drawback in that such sources can create radiological hazards.

The beam-on-target configuration generally provides continuous emission or a long train of emissions (e.g., linear accelerator designs) composed of microsecond bursts, which can be comprised of a sequence of approximately 1 ns pulses and beam energies of 5 keV to 500 keV. In order to develop appreciable numbers of neutrons, many pulses may be provided. Moreover, common plasma sources, such as dense plasma focus (DPF), can use short pulses (e.g., on the order of nanoseconds to microseconds).

In a plasma configuration, ions are commonly confined and have many opportunities to react and fuse, thereby creating neutrons. Such confinement can result in neutrons in a plasma as compared to the energy of the beam in a beam-on-target configuration. Various types of techniques for plasma generation are conventionally utilized. Examples of such techniques include inertial confinement fusion (ICF) and magnetic confinement fusion. In inertial confinement fusion, reactions can be initiated by heating and compressing a fuel target, typically in the form of a pellet that often contains a mixture of deuterium and tritium. In magnetic confinement fusion, magnetic fields can be utilized to confine hot fusion fuel in the form of plasma.

SUMMARY

Described herein are various technologies that pertain to a micro fluid-puff based neutron, x-ray, and/or energetic particle source. The micro fluid-puff based source can generate plasma, which can emit neutrons, x-rays, and the like. The micro fluid-puff based source includes a diode that inhibits current flow during a first state and allows current to flow during a second state. The diode can further include an anode and a cathode. Further, a chamber is between the anode and the cathode. Moreover, a micro-scale fluid supply (e.g., a MEMS fluid supply) can inject a puff of fluid (e.g., gas, liquid, etc.) between the anode and the cathode within the chamber, where the micro-scale fluid supply shapes the puff of fluid to form a quasispherical density profile. It is contemplated that the fluid can be a gas or a liquid, and thus, such gas or liquid can be used as a component of a pinch as described in greater detail below. Further, a pulsed power supply applies a voltage across the anode and the cathode to cause current to flow. The current can create a magnetic field, and combined effects of electric and magnetic fields compress the puff of fluid to form the plasma.

According to various embodiments, the micro fluid-puff based source can include a single micro-scale fluid supply that injects a puff of fluid between the anode and the cathode within the chamber. Hence, the micro-scale fluid supply can be oriented to form a Z pinch. In accordance with such embodiments, the micro-scale fluid supply can form the quasispherical density profile by including a nozzle that has a Mach number less than one (subsonic), equal to one (sonic) or greater than one (supersonic) and by being underexpanded (for supersonic), or by being overexpanded (for supersonic), or by being critically expanded (for supersonic or sonic), for example.

In accordance with other embodiments, the micro fluid-puff based source can include two micro-scale fluid supplies. The micro-scale fluid supplies can be oriented to intersect. For example, the micro-scale fluid supplies can be oriented to form an X pinch; however, other geometries are intended to fall within the scope of the hereto appended claims. Accordingly, a first puff of fluid can be injected between the anode and the cathode within the chamber from a first micro-scale fluid supply, and a second puff of fluid can be injected between the anode and the cathode within the chamber from a second micro-scale fluid supply. The fluid puffs from the first micro-scale fluid supply and the second micro-scale fluid supply can be concurrently injected into the chamber, and can intersect within the chamber (e.g., halfway between the anode and the cathode) to form a single pinch having a quasispherical density profile (e.g., the X pinch). Moreover, the voltage can be applied across the anode and the cathode (e.g., by the pulsed power source) to compress the quasispherical density profile of fluid (e.g., of crossed or annular puffs of fluid) to form the plasma. Alternatively, a plenum designed in parallel can be utilized to yield an X pinch.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
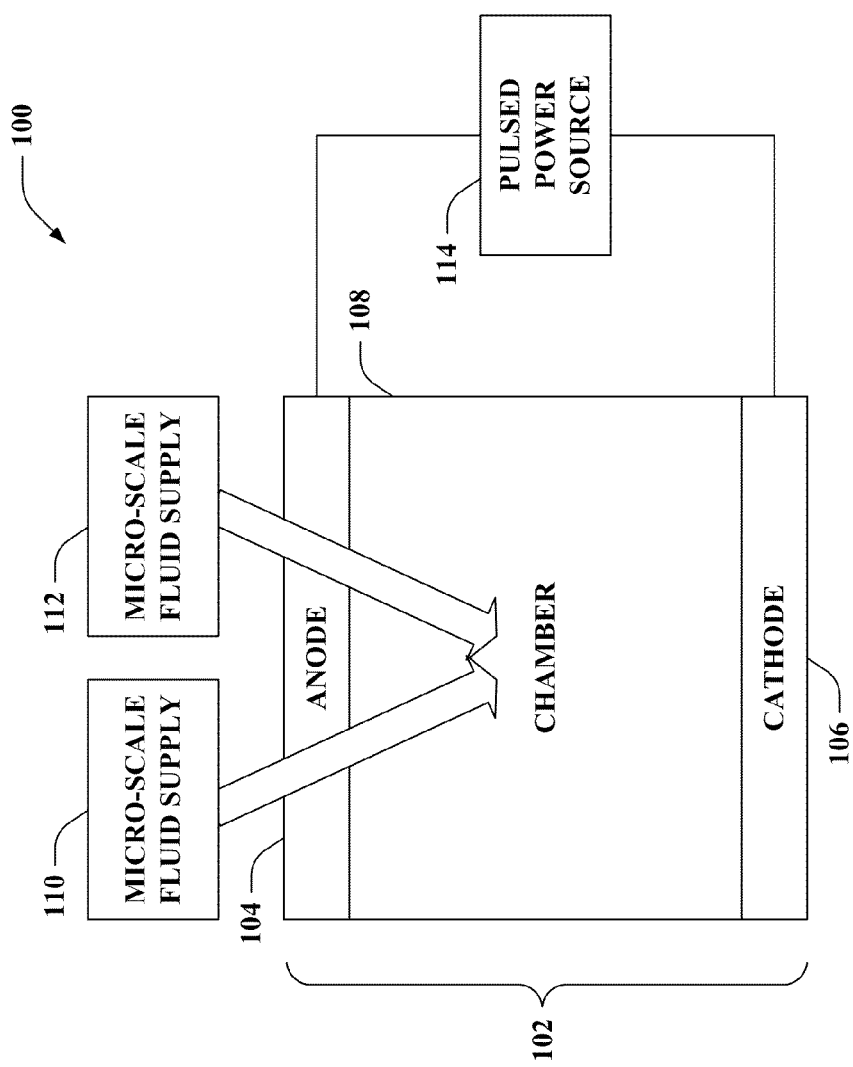
FIG. 1 illustrates a block diagram of an exemplary micro fluid-puff based source of neutrons, x-rays, or energetic particles.

Various technologies pertaining to a micro fluid-puff based source for neutrons, x-rays, energetic particles, and the like are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The micro fluid-puff based source described herein can form a plasma that includes hot dense material. Such plasma can be a source of neutrons, x-rays, energetic particles, and so forth. For instance, the plasma can be a source of continuum x-rays or inner shell line radiation, which can be used for medical or other purposes where useful to utilize bright x-rays that can be efficiently generated; yet, the claimed subject matter is not so limited.

As set forth herein, the micro fluid-puff based source is a small scale device with optimized parameters. For example, performance of the micro fluid-puff based source can be enhanced as compared to conventional sources by optimally coupling particle density profiles and physical scales to a primary power source. Moreover, the micro fluid-puff based source can include precision microcomponents that can provide higher densities and more precise density profiles as compared to conventional sources. Further, the micro fluid-puff based source can employ differing operating principles compared to many conventional approaches, such as dense plasma focus technology, thereby providing pinches that comparatively can have improved energy densities and performance. Accordingly, the micro fluid-puff based source can have enhance performance in single shot and/or repetitive operation for generation of neutrons, x-rays, energetic particles, etc. in a micro or meso scale.

The micro fluid-puff based source can provide such enhanced performance by employing a pinch with an aspect ratio that differs from conventional aspect ratios. Typical pinches oftentimes are tall and thin; in contrast, the pinch provided by the micro fluid-puff based source can be short and wide (e.g., a quasispherical density profile which is non-uniform between an anode and a cathode), and can have a higher density of fluid. The micro fluid-puff based source can use micro technology to provide for higher pressure, precision, and control of such quasispherical density profile.

Referring now to the drawings, FIG. 1 illustrates a micro fluid-puff based source 100 of neutrons, x-rays, or energetic particles. The micro fluid-puff based source 100 can be a micro gas-puff based source or a micro liquid-puff based source. The micro fluid-puff based source 100 includes a diode 102. The diode 102 can include two separated electrodes. For instance, the diode 102 can include an anode 104 and the cathode 106. Moreover, a chamber 108 is between the anode 104 and the cathode 106. The chamber 108 can further extend outside of the volume between the anode 104 and the cathode 106. Pursuant to an example, the chamber 108 can be a vacuum chamber or a low pressure chamber (e.g., with a pressure less than one atmosphere, with a pressure less than 10 Torr, etc.); yet, it is contemplated that the claimed subject matter is not so limited.

The micro fluid-puff based source 100 further includes a micro-scale fluid supply 110. The micro-scale fluid supply 110 can inject a puff of fluid (e.g., jet of fluid, etc.) between the anode 104 and the cathode 106 within the chamber 108. The fluid injected by the micro-scale fluid supply 110 can be a puff of gas, a puff of liquid, etc. Further, the micro-scale fluid supply 110 can shape the puff of fluid to form a quasispherical density profile. According to an example, the micro-scale fluid supply 110 can be embedded in the anode 104. By way of another example, the micro-scale fluid supply 110 can be embedded in the cathode 106.

According to an example, the micro-scale fluid supply 110 can be a microelectromechanical systems (MEMS) fluid supply (e.g., a MEMS gas supply, a MEMS liquid supply, etc.). However, it is to be appreciated that component(s) of the micro-scale fluid supply 110 or the micro-scale fluid supply 110 in general need not be MEMS devices. For example, the micro-scale fluid supply 110 or components thereof can be manufactured via electrical discharge machining (EDM). Thus, the micro-scale fluid supply 110 can include a nozzle and a valve, where the valve can be substantially any valve that can operate quickly and provide for fast transport of material (e.g., the fluid) and the nozzle can be substantially any nozzle that has an appropriate mechanical shape and structure.

Pursuant to various embodiments, the micro fluid-puff based source 100 can include one micro-scale fluid supply (e.g., the micro-scale fluid supply 110) to inject fluid into the chamber 108. Moreover, according to other embodiments, the micro fluid-puff based source 100 can include a second micro-scale fluid supply, namely, a micro-scale fluid supply 112, to inject fluid into the chamber 108. The micro-scale fluid supply 110 and the micro-scale fluid supply 112 are collectively referred to herein as the micro-scale fluid supplies 110-112.

According to embodiments where the micro fluid-puff based source 100 includes the two micro-scale fluid supplies 110-112, the micro-scale fluid supply 112 can inject a second puff of fluid between the anode 104 and the cathode 106 within the chamber 108. Further, the micro-scale fluid supply 112 can shape the second puff of fluid. Moreover, the fluid puffs can intersect within the chamber 108 to provide the quasispherical density profile (e.g., within a volume at which two puffs of fluid intersect). The micro-scale fluid supply 112 can be embedded in the anode 104 or the cathode 106, for example (e.g., the micro-scale fluid supplies 110-112 can both be embedded in the anode 104 or the micro-scale fluid supplies 110-112 can both be embedded in the cathode 106).

The micro fluid-puff based source 100 further includes a pulsed power source 114 coupled to the anode 104 and the cathode 106 of the diode 102. The pulsed power source 114 can apply a voltage across the anode 104 and the cathode 106 to cause compression of the puff of fluid supplied by the micro-scale fluid supply 110 to form a plasma. Further, if the micro fluid-puff based source 100 includes the two micro-scale fluid supplies 110-112, then the pulsed power source 114 can apply the voltage across the anode 104 and the cathode 106 to cause compression of the first puff of fluid injected by the micro-scale fluid supply 110 and the second puff of fluid injected by the micro-scale fluid supply 112 to form a plasma.

In accordance with embodiments where the micro fluid-puff based source 100 includes the two micro-scale fluid supplies 110-112, various respective orientations of the micro-scale fluid supplies 110-112 are contemplated such that fluid puffs injected by the micro-scale fluid supplies 110-112 intersect. For example, the micro-scale fluid supply 110 and the micro-scale fluid supply 112 can be oriented to form an X pinch. According to another example, the intersecting fluid puffs from the micro-scale fluid supplies 110-112 can form a Y shaped structure as opposed to the X shaped structure (e.g., the X pinch). According to other examples, it is contemplated that the micro-scale fluid supplies 110-112 can be configured to provide geometries such as converging pinches, annular shells, or the like. Alternatively, according to embodiments where the micro fluid-puff based source 100 includes one micro-scale fluid supply (e.g., the micro-scale fluid supply 110), the micro-scale fluid supply 110 can be oriented to form a Z pinch.

The plasma generated by the micro fluid-puff based source 100 can emit neutrons according to various embodiments. In accordance with other embodiments, the plasma generated by the micro fluid-puff based source 100 can emit x-rays or energetic particles. However, it is to be appreciated that the claimed subject matter is not limited to emission of neutrons, x-rays, or energetic particles. Moreover, while many of the examples set forth herein pertain to neutron emission, it is contemplated that such examples can be extended to x-ray emission or the like.

The micro fluid-puff based source 100 can provide short pulses on a nanosecond scale with higher yields per unit stored energy than conventional beam target or plasma generators in small devices. The micro fluid-puff based source 100 can provide nominally intense neutron bursts (e.g., yields of $10^5$ to $10^{11}$ neutrons per pulse) on the order of a nanosecond in a compact package. According to an example, a pulse width of the neutrons emitted by the plasma generated by the micro fluid-puff based source 100 can be between one nanosecond and one hundred nanoseconds. Pursuant to another example, a pulse width of the neutrons emitted by the plasma generated by the micro fluid-puff based source 100 can be between one nanosecond and ten nanoseconds. By way of a further example, the pulse width of the neutrons emitted by the plasma generated by the micro fluid-puff based source 100 can be less than one nanosecond. In accordance with another example, a compressed spot size of the plasma generated by the micro fluid-puff based source 100 can be between 1 micron and 100 microns; however, it is contemplated that for various applications (e.g., fusion power), the compressed spot size of the plasma may be greater than 100 microns. Moreover, the micro fluid-puff based source 100 can operate at a rate on the order of kilohertz, for example. It is to be appreciated, however, that the claimed subject matter is not limited to the foregoing examples.

The micro fluid-puff based source 100 can provide increased production efficiency of neutrons compared to conventional beam target or other plasma generation techniques. Hence, increased production of neutrons produced versus stored energy (e.g., volume of the supply) can result. Moreover, due to narrow pulse widths, time-of-flight measurements can be enhanced using the micro fluid-puff based source 100. Further, due to being manufactured in MEMS and employing repetitive puffs of gas or liquid, the micro fluid-puff based source 100 can be robust and long-lived (e.g., since plasma is not created from solid surfaces as compared to techniques that use cryogenic wires or solid targets, etc.).

The micro fluid-puff based source 100 can provide a bright, energy efficient compact neutron source. Moreover, the neutron source can be pulsed at a high rate (e.g., on the order of kilohertz). Further, the micro fluid-puff based source 100 can be associated with low gamma production since such device can have low impedance. For instance, the micro fluid-puff based source 100 can be a lower voltage plasma generator as compared to conventional bright plasma sources.

It is contemplated that the micro fluid-puff based source 100 can be utilized for various applications. For example, the micro fluid-puff based source 100 can be utilized for imaging performed by time-of-flight resolution. Following this example, energy spectral interpretation can be obtained with a few point detectors, located at multiple locations, which can provide a three-dimensional point-spread-function (e.g., image) without an imaging array of sensors or pixels. Further, the micro fluid-puff based source 100 can be compatible with point source irradiation and triangulation of time-of-flight histories of a source, transmitted, scattered and reacting particles. According to yet another example, the micro pinch gas or liquid puff or jet based source 100 can be utilized as a source for extreme ultraviolet lithography (EUVL). Following the foregoing example, the micro fluid-puff based source 100 can be an x-ray source; yet, the claimed subject matter is not so limited. The micro fluid-puff based source 100 can be used as a source for EUVL, for instance, if combined with a magnetic mirror or electrostatic deflection. By way of yet a further example, the micro fluid-puff based source 100 can be used as a portable scale neutron source for characterizing industrial systems (e.g., turbine blades in motion, oil well logging, tunnel imaging, mine detection, state of health machinery monitoring, etc.), and the like. In accordance with another example, the micro fluid-puff based source 100 can be employed to create fusion power (e.g., since a magnetic field created can confine fusion particle ash, etc.).

Figure 2:
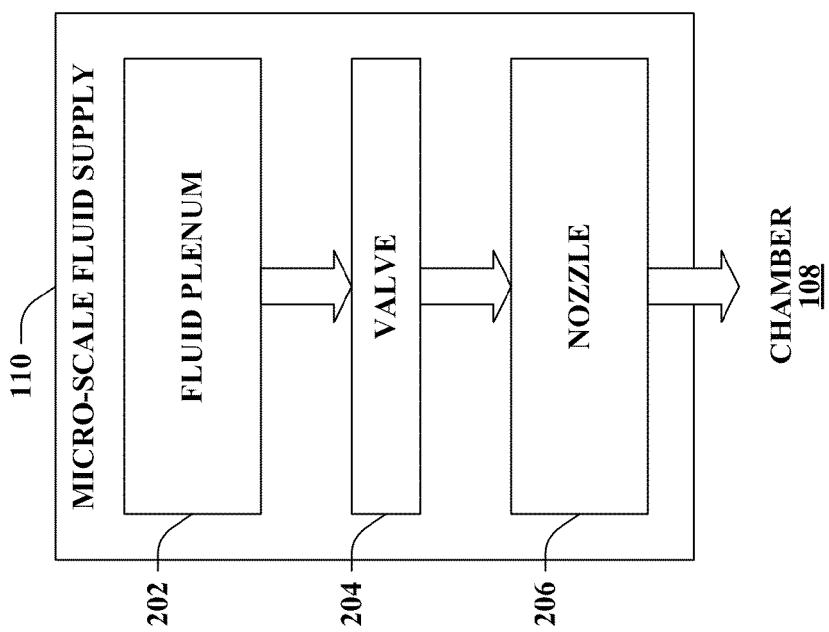
FIG. 2 illustrates a block diagram of an exemplary micro-scale fluid supply included in the micro fluid-puff based source of FIG. 1.

Now turning to FIG. 2, illustrated is the micro-scale fluid supply 110 of the micro fluid-puff based source 100 of FIG. 1. The micro-scale fluid supply 110 includes a fluid plenum 202 that houses a fluid at an input pressure. For example, the fluid plenum 202 can be a gas plenum that houses a gas at the input pressure (as describe in connection with many of the following examples); yet, it is also contemplated that the fluid plenum 202 can be a liquid plenum that houses a liquid. Moreover, the micro-scale fluid supply 110 includes a valve 204 coupled to the fluid plenum 202. The micro-scale fluid supply 110 further includes a nozzle 206 coupled to the valve 204. The micro-scale fluid supply 110 can inject a puff of gas (or liquid) between the anode 104 and the cathode 106 within the chamber 108 by opening the valve 204 to allow the gas (or liquid) from the fluid plenum 202 to pass through the valve 204 and the nozzle 206 and flow into the chamber 108. Further, it is contemplated that the micro-scale fluid supply 112 of FIG. 1 can be substantially similar to the micro-scale fluid supply 110 depicted in FIG. 2 (according to embodiments where the micro fluid-puff based source 100 includes the two micro-scale fluid supplies 110-112).

Properties of the fluid plenum 202, the valve 204, the nozzle 206, and the chamber 108 can control the shape of the puff of gas (or puff of liquid) injected by the micro-scale fluid supply 110 into the chamber 108 to yield the quasispherical density profile within the chamber 108 (e.g., whether from a single micro-scale fluid supply or more than one micro-scale fluid supply). Thus, such properties can be set to enable the quasispherical density profile to be formed. While many of the following examples are in the context of retaining and injecting gas, it is contemplated that such examples can be extended to retaining and injecting liquid.

The fluid plenum 202 can be a reservoir that has gas retained therein at the input pressure. The input pressure, for instance, can be a property that affects the shape the puff of gas. By way of example, the input pressure within the fluid plenum 202 can be between 1 atmosphere and 100 atmospheres. Further, the fluid plenum 202 can be a thin walled structure (rather than a thick walled structure) due to the small spatial scale and high local material strength.

The valve 204 can be an electrostatically actuated MEMS valve, for instance; yet, the claimed subject matter is not so limited. According to various examples, the valve 204 can operate up to 1 kHz; yet, the claimed subject matter is not so limited. The valve 204 can be used to feed gas to the nozzle 206.

Moreover, the nozzle 206 can be a MEMS fabricated nozzle; however, the claimed subject matter is not so limited. A shape of the nozzle 206 can be another property that affects the shape of the puff of gas. For example, the nozzle 206 can be a converging/diverging nozzle. For instance, the nozzle 206 can be fabricated in a silicon-on-insulator (SOI) wafer.

Nozzles having various Mach numbers are intended to fall within the scope of the hereto appended claims. The Mach number is a speed of the gas divided by a speed of sound in the gas. The Mach number is an example of a feature of the nozzle 206 that can impact the shape of the puff of gas. According to various embodiments, the nozzle 206 can be a supersonic nozzle, and thus, can have a Mach number between one and ten. According to other embodiments, the nozzle 206 can have a Mach number less than one.

Moreover, a nozzle throat area can be small as compared to an exit area of the valve 204 resulting in a high supersonic Mach number at the exit. Alternatively, an area ratio (e.g., the exit area of the valve 204 to the nozzle throat area) can be sufficiently small such that the exit area of the valve 204 is a small contoured pinhole (e.g., submicron to a few microns) connecting the fluid plenum 202 to the chamber 108. In this case the exit Mach number is likely to be sonic for a high enough pressure ratio (plenum pressure to chamber pressure), otherwise it may be subsonic.

According to embodiments where neutrons are generated, the gas housed in the fluid plenum 202 and injected into the chamber 108 can be deuterium and/or tritium. For example, the gas can be pure deuterium gas (DD). Pursuant to another example, the gas can be 50% deuterium and 50% tritium (DT). Thus, the repetitively operated valve 204 can selectively control injection of DD gas or DT gas into the chamber 108, where the DD gas or DT gas can form a pinch. By way of illustration, modeling can suggest the following. A 10 J at the wall plug pulse can provide greater than $10^5$ DT neutrons and $10^3$ DD neutrons. At 1 kHz, greater than $10^8$ and $10^6$ neutrons per second can be provided for DT and DD, respectively, with a 250 micron anode-cathode gap. Further, a DT gas puff device can provide greater than $10^{12}$ neutrons/second with a 100 kW pulse operating at 1 kHz. Accordingly, the MEMS approach described herein can provide high pulse rates and yields. Yet, it is to be appreciated that the claimed subject matter is not limited to the foregoing illustration.

Pursuant to embodiments where x-rays are generated, the gas housed in the fluid plenum 202 and injected into the chamber 108 can be a noble gas (e.g., Argon, Neon, etc.). Similar to above, the repetitively operated valve 204 can selectively control injection of the noble gas into the chamber 108, where the noble gas can form a pinch.

According to an example, minimizing dead volume can enable pressure in the fluid plenum 202 to be rapidly controlled. Moreover, response time can be minimized by incorporating the valve 204 in a nozzle chip. According to an example, the valve 204 can be actuated in less than 50 µs with a 75 to 100 V actuation signal. Therefore, the valve 204 can be opened and flow established prior to the pulsed power source 114 of FIG. 1 firing a 10 to 100 ns electrical pulse, where such pulse creates the pinch. The valve 204 can then be closed, and a vacuum pump can purge the chamber 108. Firing rates in the millisecond range are possible. Timing of opening the valve 204 can be controlled such that the valve 204 is opened to allow the puff of gas to travel into the chamber 108 without reaching a back wall of the chamber 108 prior to interacting with an electron beam. With a power pulse generated by the pulsed power source 114 timed to fire shortly after opening of the valve 204, the micro-scale fluid supply 110 combined with repetitive pulsed power source 114 can provide many pulses from a small system.

By employing a gas puff, less damage can result and the micro fluid-puff based source 100 can have a longer life as compared to a source that employs solid wires. Moreover, valve 204 can provide low, adjustable mass loads to vary operation of the micro fluid-puff based source 100.

Figure 3:
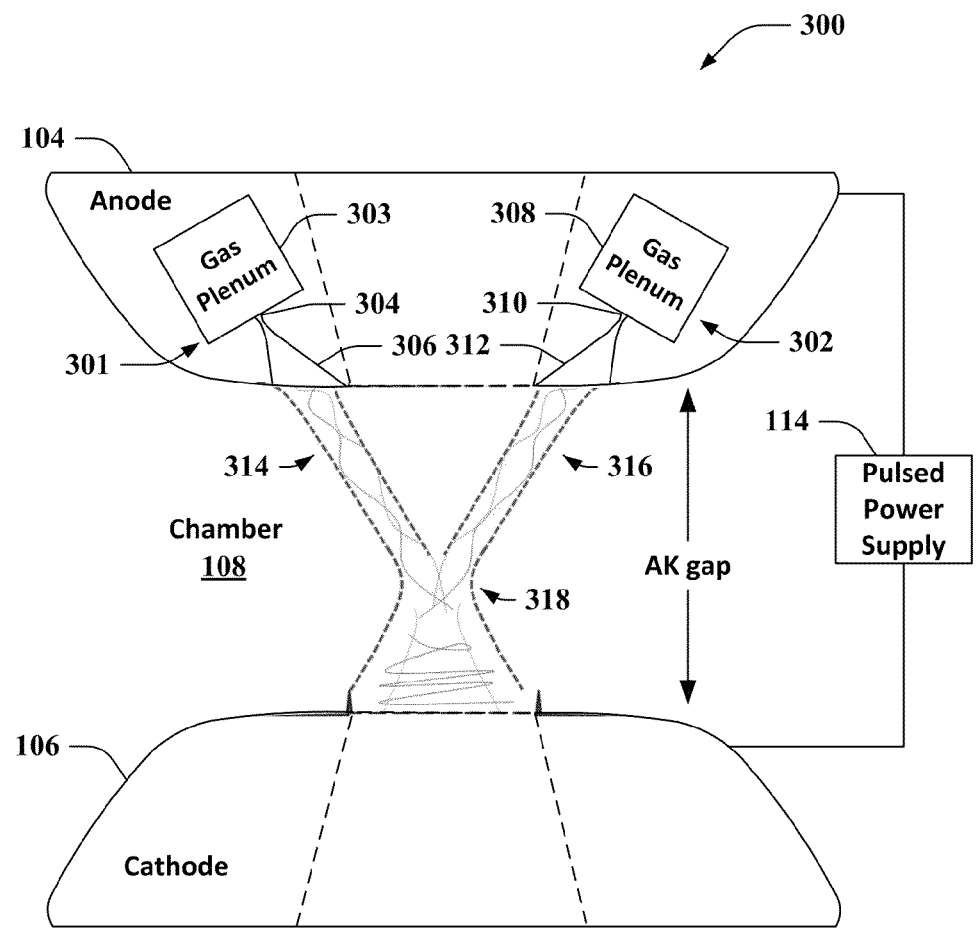
FIG. 3 illustrates a schematic diagram of an exemplary micro gas-puff based source that generates a micro X pinch as a small scale neutron source.

With reference to FIG. 3, illustrated is a micro gas-puff based source 300 that generates a micro X pinch as a small scale neutron source. While FIG. 3 describes the micro gas-puff based source 300, it is contemplated that the following examples can be extended to a micro liquid-puff based source (or a micro fluid-puff based source generally). The micro gas-puff based source 300 includes the anode 104 and the cathode 106 (e.g., the diode 102 of FIG. 1). The chamber 108 is between the anode 104 and the cathode 106. The anode 104 and the cathode 106 are separated by an anode-cathode (AK) gap. Moreover, the micro gas-puff based source 300 includes a MEMS gas supply 301 (e.g., the micro-scale fluid supply 110 of FIG. 1) and a MEMS gas supply 302 (e.g., the micro-scale fluid supply 112 of FIG. 1) oriented to form an X pinch. The MEMS gas supply 301 includes a gas plenum 303, a valve 304, and a nozzle 306. Similarly, the MEMS gas supply 302 includes a gas plenum 308, a valve 310, and a nozzle 312. The MEMS gas supply 301 injects a gas puff 314 into the chamber 108, and the MEMS gas supply 302 injects a second gas puff 316 into the chamber 108. The gas puff 314 and a gas puff 316 intersect at an intersection volume 318, where the intersection volume 318 has a quasispherical shape. Moreover, the micro gas-puff based source 300 further includes the pulsed power supply 114. While the micro gas-puff based source 300 of FIG. 3 is described as including the MEMS gas supplies 301-302, it is to be appreciated that the claimed subject matter is not limited to the supplies being MEMS devices (e.g., instead manufactured using EDM, lithographic techniques, or other micromachining approaches, etc.). Moreover, while two MEMS gas supplies 301-302 are depicted, it is contemplated that a single MEMS gas supply can feed both legs of the pinch (e.g., the single MEMS gas supply can inject the gas puff 314 and the gas puff 316).

An initial density, jet diameter, and density profiles can be coupled to stored pulsed power. For instance, a short AK gap can be utilized. Moreover, nozzles (e.g., the nozzles 306 and 312) with various Mach numbers can be employed for the MEMS gas supplies 301-302. For instance, a nozzle with a low Mach number can create slower moving gas at higher pressure while offering a less well-defined density structure, whereas a nozzle with a high Mach number can provide a well-defined structure to the gas puff so that the gas does not spray over the chamber 108. It is contemplated that various parameters can be controlled for the micro gas-puff based source 300. Such parameters include pinch mass, density profiles, gap configurations, input pressure (e.g., within the gas plenums 303 and 308), back pressure (e.g., within the chamber 108), and the like. Moreover, the valves 304 and 310 can open fast (e.g., less than one microsecond) to provide that the gas does not fill the gap, and to allow control over density profiles and current flow.

According to an example, the AK gap can be between 100 microns and 1000 microns. Moreover, an initial radius of each gas puffs 314-316 (e.g., gas jets) can be between 50 microns and 200 microns, for example; yet, the claimed subject matter is not so limited. Further, the MEMS gas supplies 301-302 can employ nozzles (e.g., the nozzles 306 and 312) having various Mach numbers; the Mach numbers can range, for instance, from 0.5 to 10. However, the claimed subject matter is not so limited.

In the example depicted in FIG. 3, the MEMS gas supplies 301-302 are embedded in the anode 104; it is to be appreciated, however, that the MEMS gas supplies 301-302 can alternatively be embedded in the cathode 106 in disparate embodiments. Moreover, it is contemplated that the micro gas-puff based source 300 can include insulating structures and/or vacuum access. Such insulation can allow for power to flow into the diode across the anode-cathode gap, and the vacuum can provide that current initiates and flows along an appropriate feature of the gas puff formed by the MEMS gas supplies 301-302 within the chamber 108 (e.g., around the intersection volume 318 having the quasispherical shape).

The micro gas-puff based source 300 can provide a microscale X pinch plasma, which can supply a high neutron yield per unit stored energy. As stored energy is directly related to a size and mass of a device, a high yield/stored energy ratio can be desirable. According to an example, the plasmas generated by the micro gas-puff based source 300 can either be pure deuterium gas (DD) or 50% deuterium and 50% tritium (DT). The MEMS gas supplies 301-302 can aim and control injection of the puffs of gas into the chamber 108. The MEMS gas supplies 301-302 can be timed to inject such puffs of gas across the diode 102 with a fast rising voltage pulse supplied by the pulsed power supply 114 in an X pinch configuration. The micro gas-puff based source 300 can provide microscale X pinch plasmas that offer higher yields for smaller drivers as compared to conventional approaches. Accordingly, a yield from the micro gas-puff based source 300 can be maximized while minimizing energy, volume, and mass of the system. The X pinch gas puff can provide high temperature and high energy density plasmas for applications such as, for example, material study, the study of plasma stability, x-ray production, phase contrast imaging, acceleration of particles in intense fields, and the like.

Creating a small, bright short-pulsed neutron source using an X pinch configuration as shown in FIG. 3 can enable measuring a location based on time-of-flight so that traditional imaging may not be required, increasing depth for interpretation in oil well logging, and measuring of prompt emission characteristic measurements (e.g., such as n, gamma, etc.) in short time frames rather than utilizing signal interrogation. Moreover, having a strobed measurement rather than a time exposure can be useful for freezing motion of a moving object, and conversely, having a moving source to search when looking for landmines. By having a source that is physically small and can repetitively create short bursts of neutrons, where the full width at half maximum (FWHM) (e.g., in nanoseconds) of the emission is small compared to a travel time of the neutron, then a single short pulse method can be used to determine location of reacting materials from time-of-flight calculations.

Moreover, the X pinch configuration, as provided by the micro gas-puff based source 300 of FIG. 3, can increase neutron production efficiency over beam target or other plasma generation approaches conventionally available. For instance, such benefit can be in terms of neutrons produced versus stored energy or volume of the power supply system. The plasma source described herein can be small (e.g., on the order of microns to millimeters) and the hardware can be manufactured in silicon MEMS, which can be robust and long-lived.

The X pinch created by the micro gas-puff based source 300 can use a short, squat set of gas puffs. Accordingly, fewer molecules are heated when utilizing the configuration as shown in FIG. 3 as compared to conventional plasma generation approaches, and hence, the micro gas-puff based source 300 can be more of the efficient for heating plasma as compared to conventional approaches (e.g., approaches that employ a long, thin wires). By utilizing MEMS, two crossing boluses of low-density gas can be created in a single, highly integrated micro-fabricated device using the valve and nozzle configurations described herein. As the gas puffs intersect in the anode-cathode gap within the chamber 108 at the intersection volume 318, power can be provided across the pinch by the pulsed power supply 114, which can initiate the X pinch process. The micro-nozzles and gas valves described herein can enable the pulsed operation with low mass targets.

The MEMS gas supply 301 and the MEMS gas supply 302 can be positioned such that puff of gas 314 injected by the MEMS gas supply 301 and the puff of gas 316 injected by the MEMS gas supply 302 intersect at approximately halfway between the anode 104 and the cathode 106 within the chamber 108. Such accuracy can be achieved using submicron to hundreds of micron nozzles (e.g., the nozzles 306 and 312). Submicron and small fractional accuracy in the aiming of the nozzles 306 and 312 can be obtained by microfabrication techniques that rely on high resolution optical (e.g., microscope or laser) alignment or photolithographically defined features on a wafer. Due to a low density of gas puff jets 314 and 316 exiting the nozzles 306 and 312, and the pulsing of the jets 314 and 316 into the vacuum chamber 108 where the X pinch occurs, there is unlikely to be a significant spread of the gas jets 314 and 316 in the distance between the nozzle exit and the pinch intersection (e.g., at the intersection volume 318). Accordingly, a precise jet intersection location can be maintained (e.g., within a micron). In some cases (e.g. very low back pressure), significant spreading may occur, however this may be an effective plasma, neutron or x-ray generation operating point.

The central node formed in the micro gas-puff based source 300 has a quasispherical nature in the X pinch. The quasispherical feature can enhance the magnetic field characteristics to provide compression dynamics that increase core pressure and temperature. Accordingly, advantages in terms of the ability to approach fusion conditions with quasispherical implosions, where the target design, or density profiles, force the shape of an implosion can be provided.

Pinches are Rayleigh-Taylor unstable. Creation of m=0 modes in an X pinch can offer an opportunity to create a single Rayleigh-Taylor node at a known location or increase a local magnetic field around such node. The nodes can create higher temperatures and densities than randomly seeded and distributed features of the Rayleigh-Taylor instability. An energy density and magnetic compression of a mode can provide higher compression and temperatures than obtained by employing the configuration shown in FIG. 3. However, the claimed subject matter is not so limited.

Figure 4:
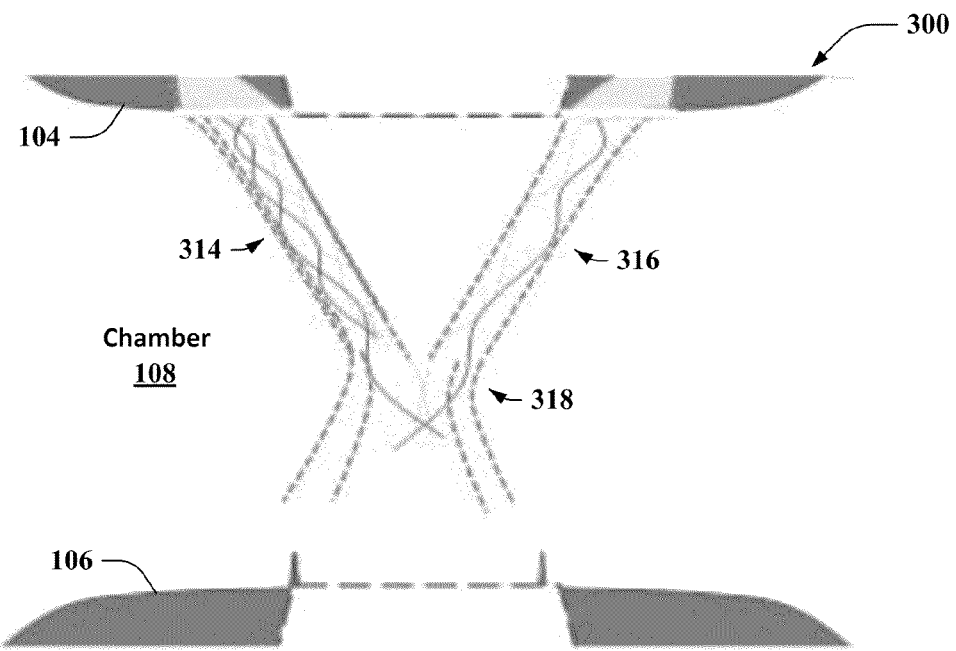
FIGS. 4-8 illustrate an exemplary depiction of evolution of a gas puff X pinch.

With reference to FIGS. 4-8, illustrated is an exemplary depiction of evolution of a gas puff X pinch. FIGS. 4-8 show five phases in the pinch. FIG. 4 illustrates a phase during which cold gas can flow into the chamber 108 from the MEMS gas supplies 301-302. Cold gas can flow for a length of time on the order of microseconds. The puff of gas 314 and the puff of gas 316 collide at the intersection volume 318.

Figure 5:
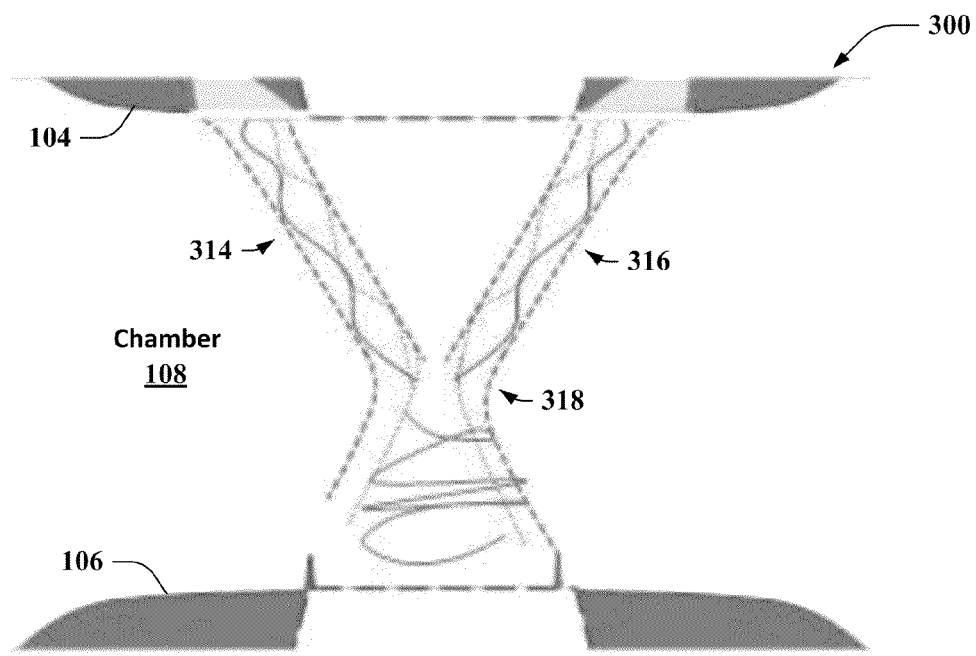

FIG. 5 illustrates a phase during which plasma current is initiated. The gas flows from the MEMS gas supplies 301-302 into the chamber 108. Prior to the gas puffs 314 and 316 reaching the cathode 106, the pulsed power supply 114 can apply the voltage across the anode 104 and the cathode 106. The voltage can be applied on the order of nanoseconds to hundreds of nanoseconds. Such voltage can create current that can flow between the anode 104 and the cathode 106. The current can flow on an outside of the gas puffs 314 and 316. Accordingly, the current can flow on the outside of the quasispherical density profile of the gas at the intersection volume 318.

Figure 6:
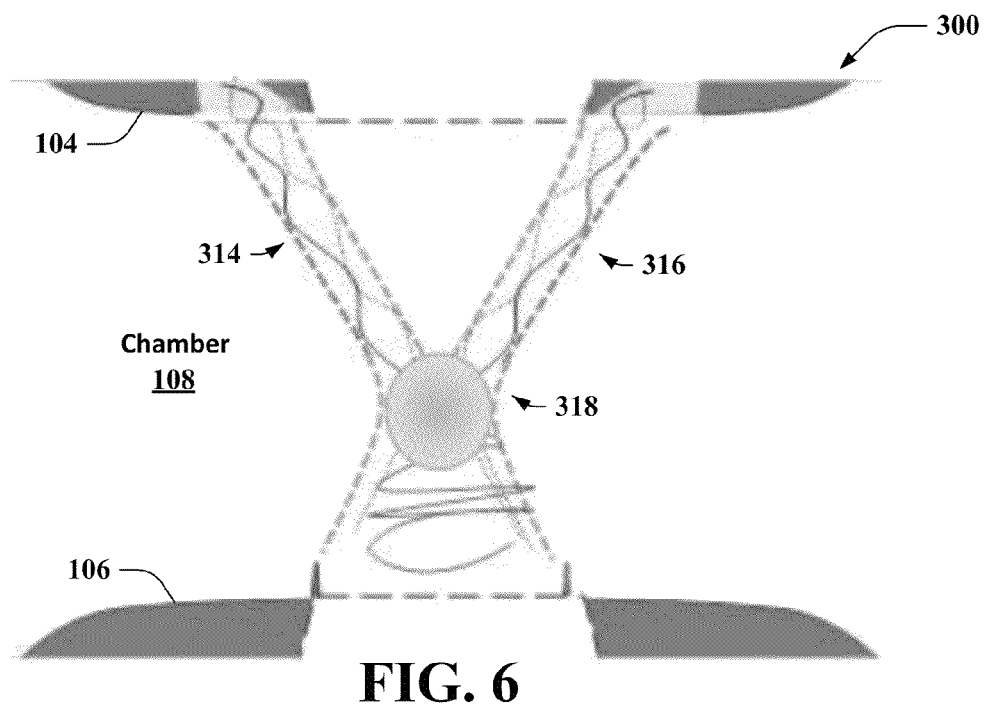

FIG. 6 illustrates a phase during which a magnetic field can be formed. The current between the anode 104 and the cathode 106 can increase, and an electric field can be excluded from the gas. The foregoing can create a rough current sheath, which can initiate forming a magnetic field structure. The formation of the magnetic field can be on the order of nanoseconds.

Figure 7:
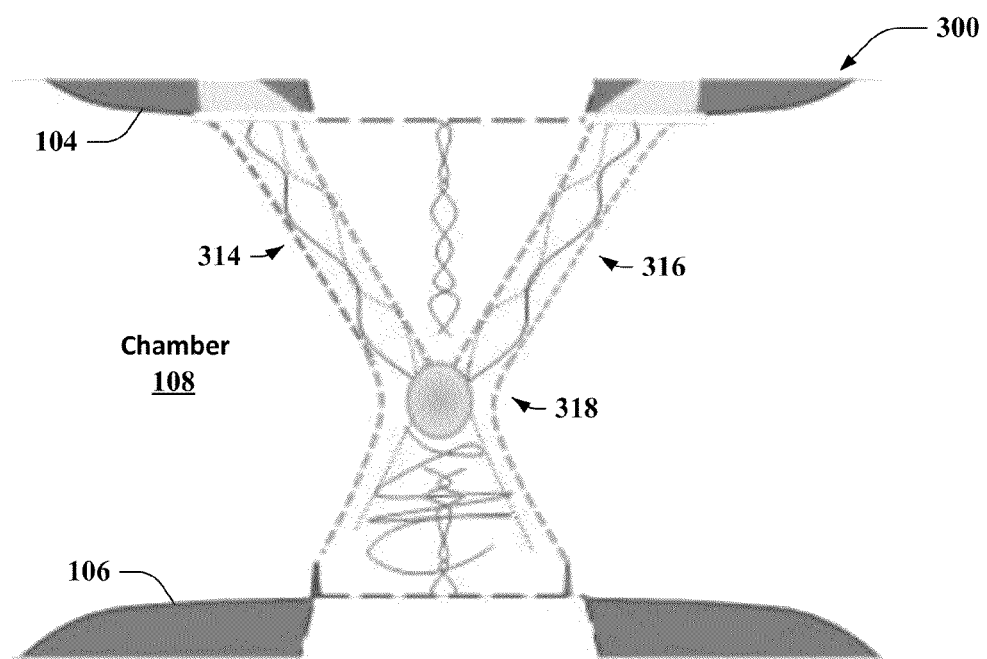
Figure 8:
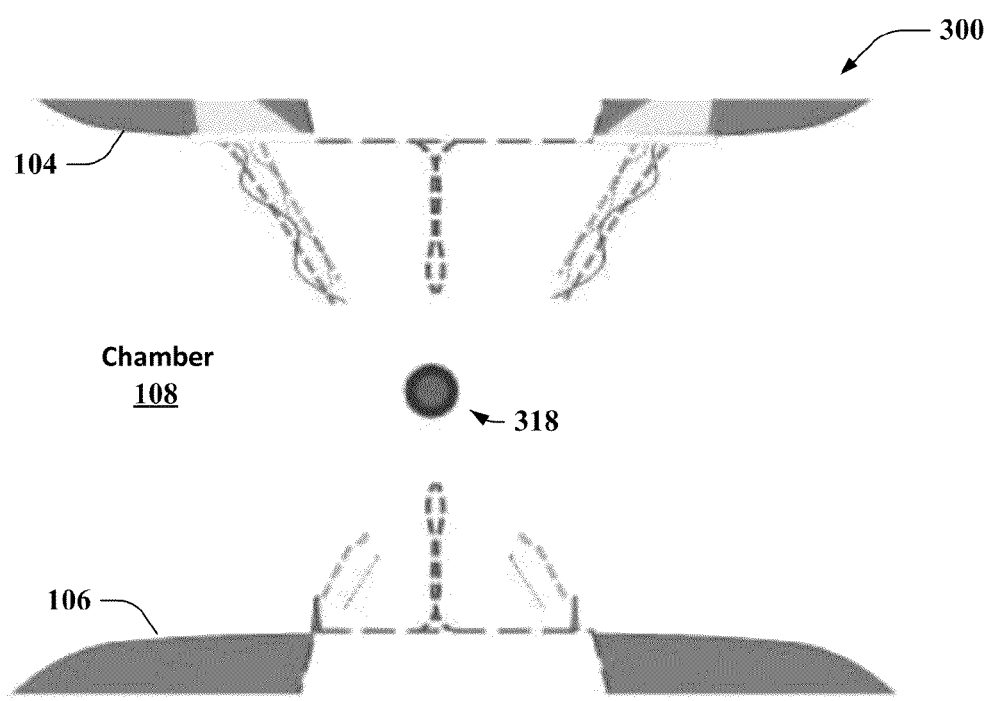

FIG. 7 illustrates a phase during which heating and compression at the intersection volume 318 occurs. The magnetic field created due to the current flow between the anode 104 and the cathode 106 can cause the compression and heating at the intersection volume 318. Moreover, jet formation can occur during such phase. FIG. 8 illustrates a phase during which final compression and breakaway of the gas puff feature from the heated quasispherical plasma at the intersection volume 318 occurs. Neutrons can be emitted during the heating and compression phase and/or the final compression and breakaway phase. Moreover, each of such phases can be on the order of many nanoseconds; yet, the claimed subject matter is not so limited.

Again, reference is made to FIG. 3. The micro gas-puff based source 300 can enhance energy provided per atom by employing low mass loads and small stored energies. In contrast, conventional approaches oftentimes push for bigger machines and larger energy drivers to provide for higher yield. A temperature of be compressed central core of the X pinch of the micro gas-puff based source 300 can be related to an energy provided by the power source. Further, the micro gas-puff based source 300 can maximize a yield by increasing an energy per unit mass rather than energy in a target.

Further, the micro gas-puff based source 300 can enable reducing an aspect ratio of the gas puffs 314 and 316 as compared to conventional gas puffs, which can enable pinch material to be efficiently heated. Moreover, the micro gas-puff based source 300 can employ controllable MEMS gas supplies 301-302, which can enable shaping the gas puffs respectively injected therefrom to tailor density profiles of the gas. Further, by employing the MEMS structure, the micro gas-puff based source 300 can be operated at high repetition rates. Also, a pinch axis can be located using lithographic techniques, so that the puffs of gas 314 and 316 intersect at the intersection volume 318 by embedding the nozzles within the surfaces of the electrode (e.g., the anode 104 or the cathode 106).

According to an example, X pinch neutron brightness from a small gas puff can be estimated from the following equation:

$$\frac{dn}{dt} = n_T n_D \langle \sigma v \rangle$$

In the foregoing equation, dn/dt is the brightness, or number of neutrons produced per second, $n_T$ is the number density ($cm^{-3}$) of the tritium if a tritium plasma is used, and $n_D$ ($cm^{-3}$) is the number density of the deuterium if deuterium is used. As noted above, it is also contemplated that pure DD gas can be used. Example values of the reaction parameter for DD and DT fusion are set forth below.

| Temp (eV) | σv for DD (cm³/s) | σv for DD (cm³/s) |
|---|---|---|
| 500 | ~$10^{-24}$ | $10^{-22}$ |
| 1,000 | $2 \times 10^{-22}$ | $6 \times 10^{-21}$ |
| 10,000 | $10^{-18}$ | $7 \times 10^{-17}$ |

Further, various yields can be provided by such X pinch. As noted above, pinch emission times can be on the order of nanoseconds. Further, pinch compressed widths can be on the order of microns, tens of microns, or hundreds of microns.

Moreover, although not shown, it is contemplated that annular gas density profiles can be utilized for a micro gas-puff based source in accordance with an example. Annular gas density profiles can result from use of annular nozzle design. For instance, a configuration that includes a nozzle placed inside a surrounding nozzle can create and annular gas flow path. Microscale assembly processes, such as various wafer bonding techniques, can be used to assemble stacked devices. Another manner by which an annular nozzle flow path can be created can be by use of an etch for the annulus directly into silicon. Following this example, a thin support section may be used across the gas-flow gap annulus at one or more small sections of a circumference, which can be small so as to not affect the gas flow significantly. Annular gas flow may offer better pinch stability earlier in time, as well as allow for longer pinch time to build high velocity in the pinch, and hence temperature, prior to final pinch compression. However, it is to be appreciated that the claimed subject matter is not limited to the foregoing.

Figure 9:
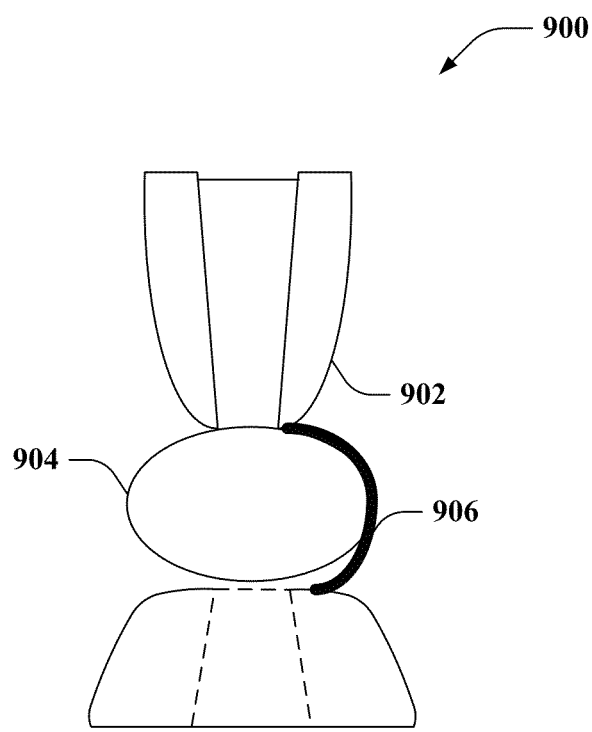
FIG. 9 illustrates a schematic diagram of another exemplary micro fluid-puff based source that includes a micro-scale fluid supply that injects a puff of fluid between an anode and a cathode within a chamber.

Now turning to FIG. 9, illustrated is another exemplary micro fluid-puff based source 900 that includes a micro-scale fluid supply that injects a puff of fluid between an anode and a cathode within a chamber. The micro fluid-puff based source 900 includes a single micro-scale fluid supply 902, which can be substantially similar to the micro-scale fluid supply 110 shown in FIG. 2.

The micro-scale fluid supply 902 includes a nozzle that has a Mach number less than one. For example, the Mach number of the nozzle of the micro-scale fluid supply 902 can be 0.5; yet the claimed subject matter is not so limited. By having a low Mach number nozzle, the micro-scale fluid supply 902 can inject a puff of fluid 904 that has a quasispherical density profile. Accordingly, when a voltage is applied across the anode and the cathode, a current sheath 906 can be formed.

For small-scale nozzles in compressible fluids at low Mach numbers, the emission can have a profile similar to an undifferentiated puff of fluid rather than a well-defined jet. Accordingly, as shown in FIG. 9, the pressure fluctuations using such a nozzle design can enable a Z pinch structure, rather than an X pinch structure, to form a quasispherical pinch similar to the pinch described above with respect to FIG. 3. Thus, quasispherical conditions for a pinch formed with a single micro-scale fluid supply (e.g., the micro-scale fluid supply 902) can be provided.

Figure 10:
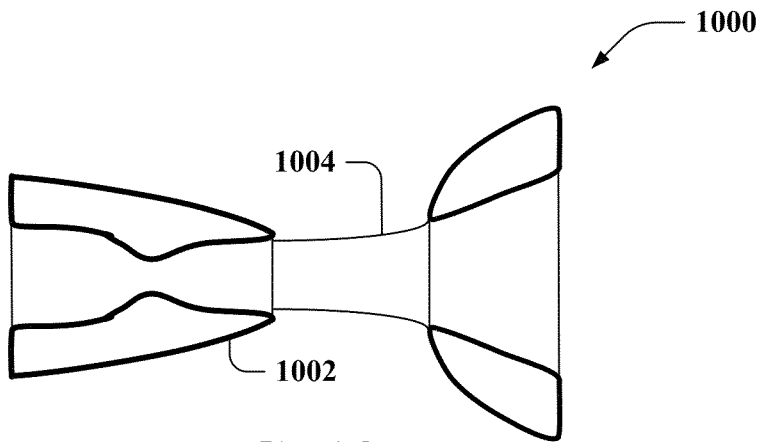
FIGS. 10-12 illustrate schematic views of another exemplary micro gas-puff based source (e.g., under various operating conditions and/or including differing nozzle designs).
Figure 11:
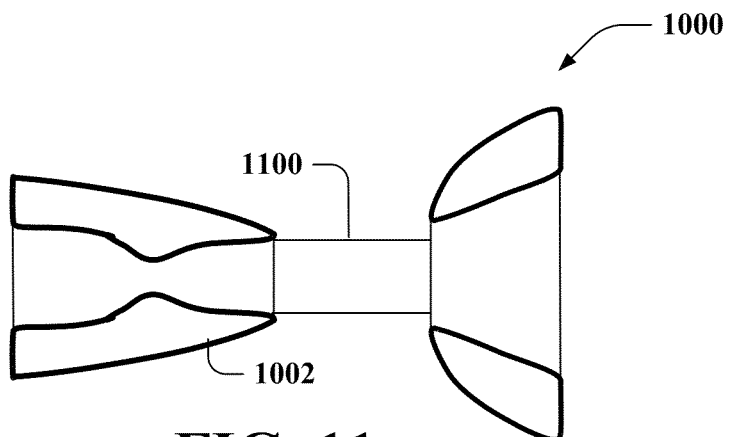
Figure 12:
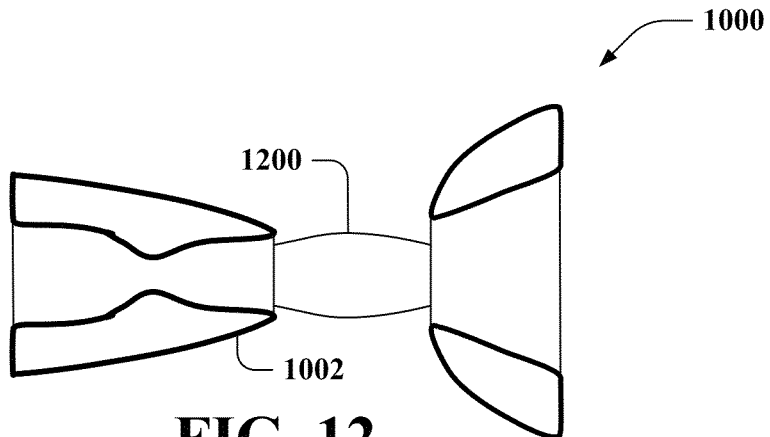

With reference to FIGS. 10-12, illustrated are views of another exemplary micro gas-puff based source 1000 (e.g., under various operating conditions and/or including differing nozzle designs). Similar to the micro fluid puff-based source 900 of FIG. 9, the micro gas-puff based source 1000 includes a single micro-scale fluid supply 1002 that injects a puff of gas between an anode and a cathode within a chamber. Again, the micro-scale fluid supply 1002 can be substantially similar to the micro-scale fluid supply 110 shown in FIG. 2. For instance, for compressible flow, over and under expanded nozzle conditions can be used and may be optimal for compression as described below.

Depending upon nozzle design and/or operating conditions of the nozzle included in the micro-scale fluid supply 1002, the nozzle can be underexpanded, critically expanded, or overexpanded. More particularly, FIG. 10 depicts a puff of gas 1004 injected between the anode and the cathode within the chamber by an underexpanded nozzle. FIG. 11 depicts a puff of gas 1100 injected between the anode and the cathode within the chamber by a critically expanded nozzle. Further, FIG. 12 depicts a puff of gas 1200 injected between the anode and the cathode within the chamber by an overexpanded nozzle.

The underexpanded nozzle shown in FIG. 10 and the overexpanded nozzle shown in FIG. 12 can generate respective puffs of gas 1004 and 1200 that have quasispherical density profiles. Accordingly, the underexpanded nozzle or the overexpanded nozzle can be utilized to form a Z pinch, which can support quasispherical implosion.

Figure 13:
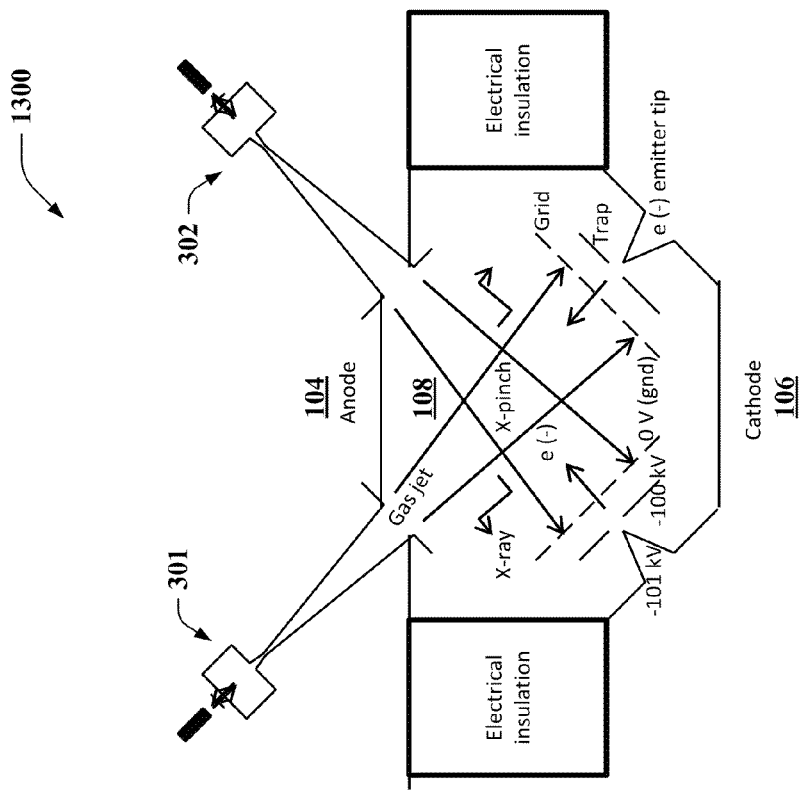
FIG. 13 illustrates a schematic diagram of an exemplary micro gas-puff based source that can emit x-rays.

With reference to FIG. 13, illustrated is an exemplary micro gas-puff based source 1300 that can emit x-rays. The micro gas-puff based source 1300 can contain injected fast electrons in order to enhance an inner shell line radiation from non-thermal electron distributions, for instance. Similar to the micro gas-puff based source 300 of FIG. 3, the micro gas puff-based source 1300 includes the anode 104, the cathode 106, the chamber 108, and the MEMS gas supplies 301-302. Similar to FIG. 3, the MEMS gas supplies 301-302 are oriented to form an X pinch. Moreover, it is contemplated that the example shown in FIG. 13 can be expanded to a micro fluid-puff based source and/or a source that includes other micro-scale fluid supplies.

The micro gas-puff based source 1300 can be a small x-ray source. Possible uses for the micro gas-puff based source 1300 include, but are not limited to, battlefield medicine, remote detection of materials hidden from view, and so forth. The micro gas-puff based source 1300 can include a micro-scale to meso-scale X pinch configured electron beam that is combined with a noble gas (e.g., supplied by the MEMS gas supplies 301-302 or in-situ) to produce ions. The ions can be used in conjunction with the electron beam to produce x-ray radiation. While an X pinch configuration is illustrated, it is contemplated that a Z pinch configuration can alternatively be employed.

In the micro gas-puff based source 1300, a pulsed electron beam can be generated using microfabricated tungsten tips and an accelerating screen, which can form the cathode 106. According to an illustration, −1 kV can generate the electrons and an additional −100 kV can accelerate the electrons into the chamber 108 (e.g., low pressure chamber) that is continuously pumped or pumped in time to the electron beam power supply pulse. The anode 104, for instance, can be at +100 kV. The ion source can result from an interaction of electrons with the noble gas (e.g., Argon, Neon, etc.) jet supplied at a high Mach number (e.g., 10) by nozzles of the MEMS gas supplies 301-302. Further, the MEMS gas supplies 301-302 can respectively include valves used to pulse the gas just in time with the electron beam pulsed power supply (e.g., pulses on the order of nanoseconds such as ten nanoseconds, etc.). Moreover, the MEMS gas supplies 301-302 can respectively include micro-to-meso-scale fabricated converging/diverging nozzles, which can accelerate the gas jets. The gas jets and electron beams can intersect in a X configuration to produce an X pinch when the ions (e.g., generated by electron collision with noble gas molecules) and electrons recombine to form a high power, short duration pulsed current, which in turn can produce x-rays. The overall size of the system can be on the order of millimeters, and x-rays can be generated in all directions from the low pressure cavity that includes the X pinch.

In the exemplary configuration depicted in FIG. 13, the electron beams and the gas jets are arranged to face each other in an X at approximately 90 degrees relative to each other. An alternate configuration can involve a system that includes the gas, which can be filled and evacuated in synchronization with the electron beam, for example. By way of yet another example, a single MEMS gas supply can inject a single gas jet, and a since electron beam can be employed (e.g., Z pinch).

Figure 14:
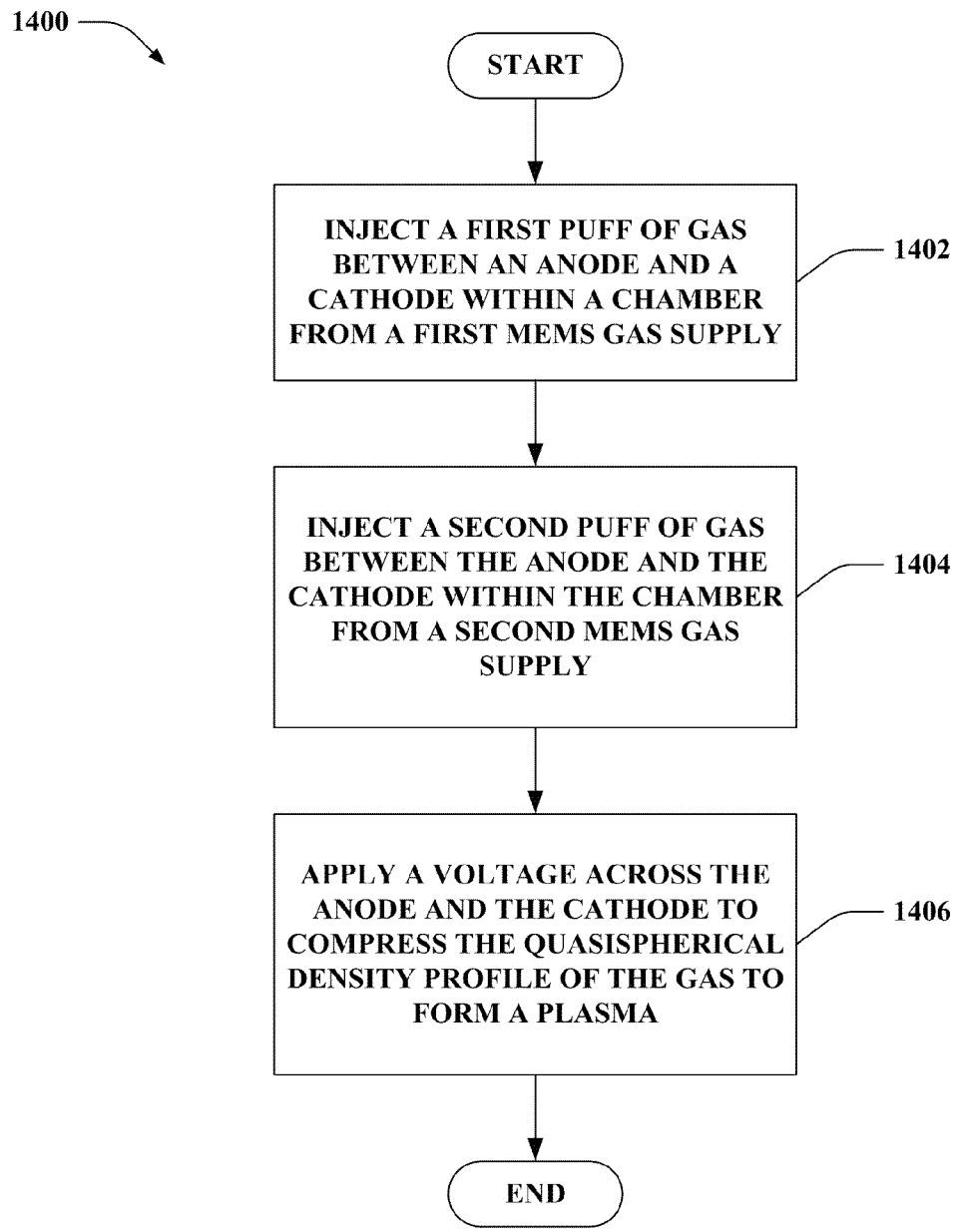
FIG. 14 is a flow diagram that illustrates an exemplary methodology of generating a plasma.

FIG. 14 illustrates an exemplary methodology relating to generating a plasma. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

FIG. 14 illustrates a methodology 1400 of generating a plasma. At 1402, a first puff of gas can be injected between an anode and a cathode within a chamber from a first MEMS gas supply. At 1404, a second puff of gas can be injected between the anode and the cathode within the chamber from a second MEMS gas supply. The first puff of gas and the second puff of gas are concurrently injected and intersect within the chamber to form a quasispherical density profile of gas. At 1406, a voltage can be applied across the anode and the cathode to compress the quasispherical density profile of the gas to form a plasma. The plasma, for instance, can emit neutrons, x-rays, and/or energetic particles. According to an example, the first puff of gas and the second puff of gas can be injected by concurrently opening a first valve comprised in the first MEMS gas supply and a second valve comprised in the second MEMS gas supply.

Further, as used herein, the term "exemplary" is intended to mean "serving as an illustration or example of something."

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A micro fluid-puff based source, comprising:
a diode that comprises an anode and a cathode;
a chamber between the anode and the cathode;
a micro-scale fluid supply that injects a puff of fluid between the anode and the cathode within the chamber, wherein the micro-scale fluid supply shapes the puff of fluid to form a quasispherical density profile, wherein the quasispherical density profile is non-uniform between the anode and the cathode, and wherein the quasispherical density profile is compressible; and
a pulsed power source coupled to the anode and the cathode, wherein the pulsed power source applies a voltage across the anode and the cathode to cause compression of the puff of fluid to form a plasma;
wherein the plasma formed by the micro fluid-puff based source emits at least one of neutrons, x-rays, or energetic particles.

2. The micro fluid-puff based source of claim 1, further comprising a second micro-scale fluid supply that concurrently injects a second puff of fluid between the anode and the cathode within the chamber, wherein the second micro-scale fluid supply shapes the second puff of fluid, and wherein the puff of fluid and the second puff of fluid intersect within the chamber to provide the quasispherical density profile.

3. The micro fluid-puff based source of claim 2, wherein the micro-scale fluid supply and the second micro-scale fluid supply are oriented to form an X pinch.

4. The micro fluid-puff based source of claim 1, wherein the micro-scale fluid supply concurrently injects the puff of fluid and a second puff of fluid between the anode and the cathode within the chamber, wherein the puff of fluid and the second puff of fluid intersect within the chamber to provide the quasispherical density profile.

5. The micro fluid-puff based source of claim 1, wherein the micro-scale fluid supply is a microelectromechanical systems (MEMS) fluid supply.

6. The micro fluid-puff based source of claim 1, wherein the fluid is a gas.

7. The micro fluid-puff based source of claim 1, wherein the plasma emits x-rays for phase contrast imaging.

8. The micro fluid-puff based source of claim 1, wherein the micro-scale fluid supply comprises:
a fluid plenum that houses the fluid at an input pressure;
a valve coupled to the fluid plenum; and
a nozzle coupled to the valve;
wherein the puff of fluid is injected between the anode and the cathode within the chamber by opening the valve to allow the fluid from the fluid plenum to pass through the valve and the nozzle into the chamber.

9. The micro fluid-puff based source of claim 8, wherein the valve and the nozzle of the micro-scale fluid supply are oriented to form a z pinch.

10. The micro fluid-puff based source of claim 8, the input pressure being between one atmosphere and one hundred atmospheres.

11. The micro fluid-puff based source of claim 8, wherein the nozzle is embedded in a surface of one of the anode or the cathode.

12. The micro fluid-puff based source of claim 8, wherein the nozzle is one of underexpanded or overexpanded to form a z pinch.

13. The micro fluid-puff based source of claim 8, wherein the nozzle has a Mach number less than one.

14. The micro fluid-puff based source of claim 8, wherein the valve is an electrostatically actuated MEMS valve.

15. The micro fluid-puff based source of claim 1, wherein the chamber is one of a vacuum chamber or a low pressure chamber with a pressure less than one atmosphere.

16. A method of generating a plasma, comprising:
injecting a first puff of gas between an anode and a cathode within a chamber from a first microelectromechanical systems (MEMS) gas supply;
injecting a second puff of gas between the anode and the cathode within the chamber from a second MEMS gas supply, wherein the first puff of gas and the second puff of gas are concurrently injected and intersect within the chamber to form a quasispherical density profile of gas; and
applying a voltage across the anode and the cathode to compress the quasispherical density profile of the gas to form the plasma, wherein the plasma emits at least one of neutrons, x-rays, or energetic particles.

17. The method of claim 16, further comprising injecting the first puff of gas and injecting the second puff of gas by concurrently opening a first valve comprised in the first MEMS gas supply and a second value comprised in the second MEMS gas supply.

18. The method of claim 16, wherein a pulse width of the neutrons is between one nanosecond and one hundred nanoseconds.

19. The method of claim 16, wherein a compressed spot size of the plasma is between one micron and one hundred microns.

20. A micro gas-puff based source, comprising:
a diode that comprises an anode and a cathode;
a chamber between the anode and the'cathode, wherein the chamber is one of a vacuum chamber or a low pressure chamber with a pressure less than one atmosphere;
a first microelectromechanical systems (MEMS) gas supply that injects a first puff of gas between the anode and the cathode within the chamber;
a second MEMS gas supply that injects a second puff of gas between the anode and the cathode within the chamber, wherein the first puff of gas and the second puff of gas intersect and are controlled to form a quasispherical density profile of gas; and
a pulsed power source coupled to the anode and the cathode, wherein the pulsed power source applies a voltage across the anode and the cathode to cause compression of the first puff of gas and the second puff of gas to form a plasma, wherein the plasma emits at least one of neutrons or x-rays.

* * * * *